United States Patent
Han et al.

(10) Patent No.: US 11,616,000 B2
(45) Date of Patent: Mar. 28, 2023

(54) METHODS AND APPARATUS TO PROVIDE ELECTRICAL SHIELDING FOR INTEGRATED CIRCUIT PACKAGES USING A THERMAL INTERFACE MATERIAL

(71) Applicant: Intel Corporation, Santa Clara, CA (US)

(72) Inventors: Dong-Ho Han, Beaverton, OR (US); Jaejin Lee, Beaverton, OR (US); Jerrod Peterson, Hillsboro, OR (US); Kyle Arrington, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/359,085

(22) Filed: Jun. 25, 2021

(65) Prior Publication Data
US 2021/0327782 A1  Oct. 21, 2021

(51) Int. Cl.
 H01L 23/373 (2006.01)
 H01L 23/60 (2006.01)
 H01L 23/552 (2006.01)
 H01L 23/528 (2006.01)

(52) U.S. Cl.
 CPC ...... H01L 23/3736 (2013.01); H01L 23/5286 (2013.01); H01L 23/552 (2013.01); H01L 23/60 (2013.01)

(58) Field of Classification Search
 CPC ............. H01L 23/3736; H01L 23/5286; H01L 23/552; H01L 23/60
 See application file for complete search history.

(56) References Cited

U.S. PATENT DOCUMENTS

| | | | | |
|---|---|---|---|---|
| 6,538,319 | B2* | 3/2003 | Terui | H01L 23/552 257/E23.079 |
| 6,740,959 | B2* | 5/2004 | Alcoe | H01L 23/552 257/659 |
| 6,967,403 | B2* | 11/2005 | Chuang | H01L 23/36 257/E23.101 |
| 7,672,132 | B2* | 3/2010 | Fitzgerald | H01L 21/4871 361/702 |
| 8,574,965 | B2* | 11/2013 | Refai-Ahmed | H01L 25/115 257/E23.001 |
| 2011/0292621 | A1* | 12/2011 | Beaumier | H01L 23/055 361/748 |
| 2020/0027844 | A1 | 1/2020 | Han et al. | |
| 2021/0101175 | A1 | 4/2021 | Arrington et al. | |
| 2021/0202348 | A1 | 7/2021 | Arrington et al. | |

* cited by examiner

Primary Examiner — Peniel M Gumedzoe
(74) Attorney, Agent, or Firm — Hanley, Flight & Zimmerman, LLC (57) ABSTRACT

Methods and apparatus are disclosed to provide electrical shielding for integrated circuit packages using a thermal interface material. An integrated circuit package includes a substrate including a ground plane layer and a solder mask; a semiconductor die attached to the substrate, the solder mask layer separating the semiconductor die from the ground plane layer; and a thermal interface material surrounding at least a portion of the semiconductor die, the thermal interface material electrically coupled to the ground plane layer.

25 Claims, 5 Drawing Sheets

METHODS AND APPARATUS TO PROVIDE ELECTRICAL SHIELDING FOR INTEGRATED CIRCUIT PACKAGES USING A THERMAL INTERFACE MATERIAL

FIELD OF THE DISCLOSURE

This disclosure relates generally to integrated circuit (IC) packages and, more particularly, to methods and apparatus to provide electrical shielding for IC packages using a thermal interface material.

BACKGROUND

In IC packages, a thermal interface material (TIM) is sometimes used to thermally couple components of the package. Additionally, a TIM can be used to dissipate heat between components of the package, such as between layers of semiconductor materials, metals, and/or dielectrics. In recent years, there has been interest in using a liquid metal TIM (LM-TIM).

The figures are not necessarily to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular. In general, the same reference numbers will be used throughout the drawing(s) and accompanying written description to refer to the same or like parts. As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another. Notwithstanding the foregoing, in the case of a semiconductor device, "above" is not with reference to Earth, but instead is with reference to a bulk region of a base semiconductor substrate (e.g., a semiconductor wafer) on which components of an integrated circuit are formed. Specifically, as used herein, a first component of an integrated circuit is "above" a second component when the first component is farther away from the bulk region of the semiconductor substrate than the second component. As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween. As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc. are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name. As used herein, "approximately" and "about" refer to dimensions that may not be exact due to manufacturing tolerances and/or other real world imperfections.

DETAILED DESCRIPTION

Methods and apparatus to provide electrical shielding for an IC package using a TIM are disclosed. A liquid metal thermal interface material (LM-TIM) can boost system performance of mobile PCs, gaming systems, etc. particularly when compared to traditional polymer TIMs. Compared to conventional TIMs, the thermal conductivity is 2-4 times higher in LM-TIMs for improved performance. Gallium based LM-TIM, while historically implemented by end-user desktop overclocking enthusiasts, has recently become technically and economically viable in high volume manufacturing (HVM) for computing devices (e.g., desktop, laptop computers, tablets, smartphones, personal computers (PCs), etc.).

However, the risk of electrical interference, such as crosstalk coupling, signal impedance (SI), and electromagnetic interference (EMI), increases with the use of a metallic TIM. Crosstalk coupling, SI, and/or EMI can adversely affect other components on the IC package and signals directly underneath the package solder mask. Additionally, the liquid nature of the metallic TIM makes it difficult to dispense and contain the TIM within an integrated circuit package. An improperly contained TIM increases the risk of electrical interference. LM-TIMs also give rise to corrosion and shorting risks. Further, the irregular extent of LM-TIM spillage onto the package substrates utilizing micro-strip routing can also cause electrical interference problems. The above technical challenges have limited the wide-spread adoption of LM-TIM. In particular, a solution to the risk of electrical interference is important due to widely-varying designs being introduced to the market.

Previous efforts have attempted to achieve consistent dispensement, application, and/or containment of LM-TIM. These efforts serve to reduce the variability in thermal performance but cannot reduce the electrical interference risks. Electrical interference issues differ as original equipment manufacturers (OEMs) and original design manufacturers (ODMs) differ because different OEM/ODM LM-TIM designs can differ significantly. While there are customer-provided (e.g., post manufacturing) shielding solutions, that can surround an IC package, such solutions fail to prevent undesirable coupling and interference that LM-TIM can cause within the IC package. Eliminating the use of micro-strip routing is another example approach for reducing electrical interference. However, eliminating micro-strip routing cannot prevent EMI and System on a Chip (SoC) immunity issues caused by undesirable couplings among multiple dies, ungrounded thermal solutions, and external radio frequency (RF) noises.

Examples disclosed herein provide proper containment of LM-TIM and reduce electrical interference in an IC package by incorporating enhanced package features such that both thermal and electrical benefits of LM-TIM can be realized by OEMs/ODMs. Examples disclosed herein provide SoC immunity from external RF noises and electrostatic discharges (ESD), and reduce (e.g., eliminate) radiated emissions from the SoC. Thus, examples disclosed herein are fully compliant to electromagnetic compatibility (EMC) regulatory requirements. Examples disclosed herein eliminate the negative impacts of crosstalk coupling, signal impedance, and EMI.

Examples disclosed herein achieve the above benefits by utilizing the high electrical conductivity of LM-TIM to make the LM-TIM itself an integral part of a die-level Faraday cage that provides a shielding solution internal to an associated IC package. For example, a solder mask layer separates a semiconductor die from a ground plane layer in an integrated circuit package. The TIM surrounds the semiconductor die and is electrically coupled to the ground plane layer, thereby forming a Faraday cage that surrounds the semiconductor die. In such examples, the LM-TIM enables thermal cooling of the die while also mitigating against undesired electromagnetic coupling and interference.

Different package features and/or designs may be implemented to electrically tie the LM-TIM to the package ground. The particular features and/or designs employed in any particular IC package depend upon the particular application for which the package is to be used. More particularly, in some examples, design choice is driven by package surface area. For example, the amount of area that is not occupied by dies in the SoC, surface components, stiffeners, and/or an integrated heat spreader (IHS) can determine the structural design of features of the package that enable the electrical coupling of a LM-TIM surrounding a die to an underlying ground plane layer.

In some examples, a first conductive layer in a package substrate supporting a die is a ground layer. In some examples, the first (ground) layer is at locations adjacent to where the LM-TIM is to be directly in contact with the package. In some examples, other signals and power are routed on the second layer and other deeper layers, (e.g., farther away from the surface of the substrate on which the die is mounted and where the LM-TIM is located). However, in some examples, micro-strip routing of signal and power lines can still be utilized. The ground layer being closer to the LM-TIM than the signal and power lines provides electrical isolation and corrosion protections for the signals and powerlines from the LM-TIM, which includes a gallium alloy that can include indium and/or tin. In some examples, an array of solder resist openings (SROs) in the substrate surrounds the die(s) to be cooled with LM-TIM. Some such SROs include a conductive material disposed therein to enable electrical coupling of the LM-TIM with the underlying ground plane layer. Thus, in some examples, the SROs are associated with ground pads that are to be in contact with the LM-TIM. Such grounds pads are distinct from ground pads used for decoupling capacitors and distinct from terminal pads for power and ground. In some examples, the conductive material within the SROs has a nickel finish and/or are made of an electrically conductive adhesive (ECA) to provide protection against gallium corrosion.

Figure 1:
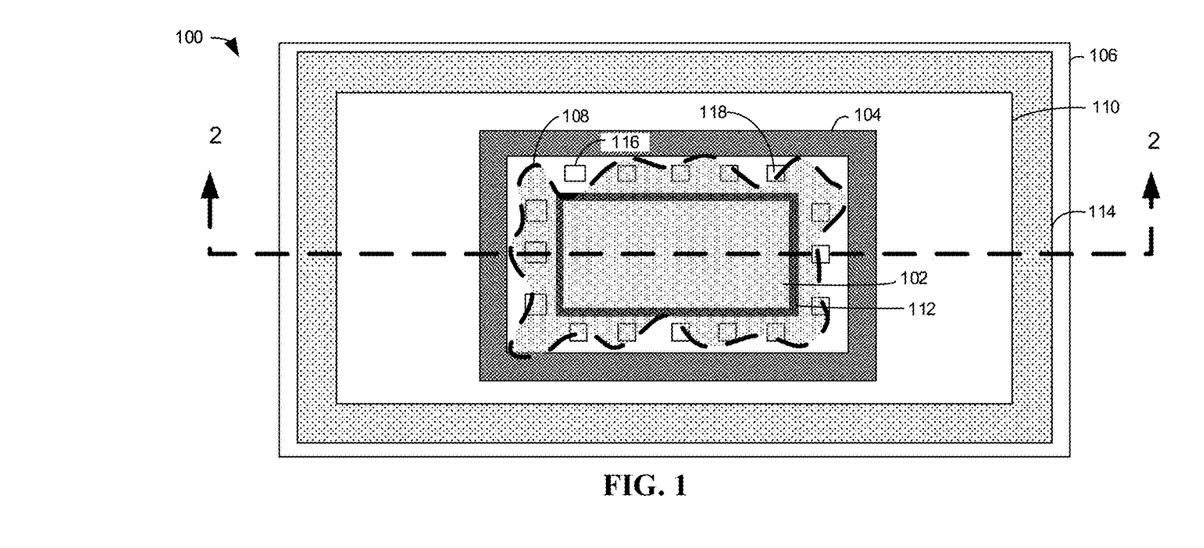
FIG. 1 is a plan view of an example IC package constructed in accordance with teachings disclosed herein.
Figure 2:
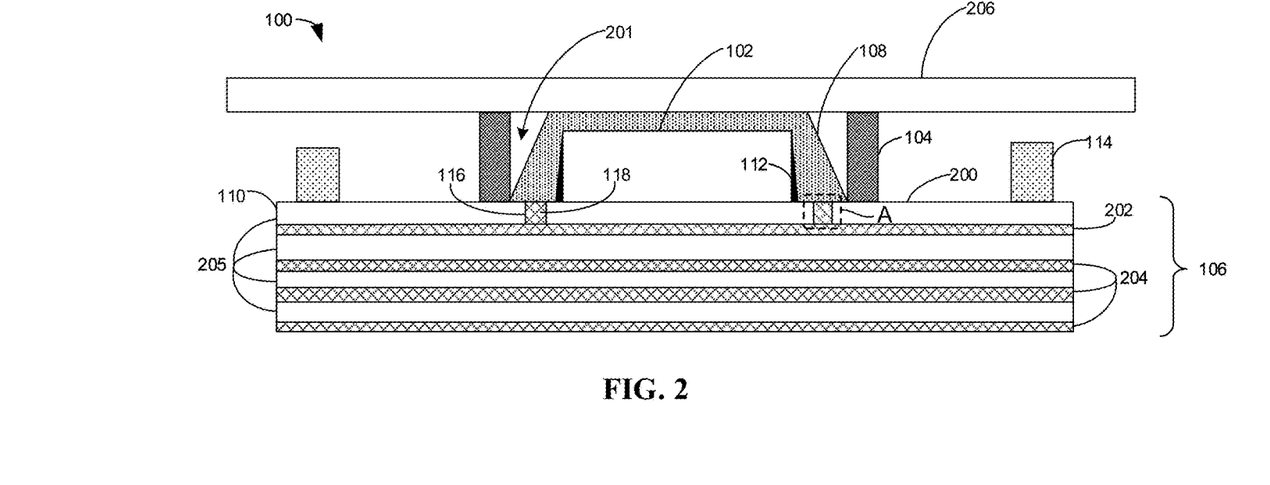
FIG. 2 is a cross-sectional view of the example IC package of FIG. 1 taken along line 2-2.

FIG. 1 is a plan view of an example IC package 100 constructed in accordance with teachings disclosed herein. FIG. 2 is a cross-sectional view of the example IC package 100 taken along line 2-2 of FIG. 1. As shown in the illustrated example, the IC package 100 includes a semiconductor die 102 mounted on an upper surface 200 of a package substrate 106. The semiconductor die 102 is surrounded by a barrier 104 that serves as a means for containing a LM-TIM 108, that fills the space between the barrier 104 and the semiconductor die 102. The LM-TIM 108 is a means for dissipating heat from the semiconductor die 102.

In FIG. 1, the LM-TIM 108 is shown with an irregular shape for purposes of illustration to represent the liquid nature of the LM-TIM 108. In actual implementation, the volume of the LM-TIM 108 is sufficient to completely cover the portion of the upper surface 200 exposed between the semiconductor die 102 and the barrier 104. More particularly, in some examples, the volume of the LM-TIM 108 is sufficient to not only cover the upper surface 200 but also to fully cover or enclose the semiconductor die 102 as represented in FIG. 2. As with FIG. 1, the shape of the LM-TIM 108 shown in FIG. 2 is for purposes of illustration and not necessarily the shape the LM-TIM 108 would actually take when filling the space between the barrier 104 and the semiconductor die 102. More particularly, FIG. 2 shows gaps 201 above the LM-TIM 108 to indicate the volume of the LM-TIM 108 is less than the space inside the barrier 104 and surrounding the semiconductor die 102. Using less of the LM-TIM 108 than the entire space defined within the barrier allows the LM-TIM 108 to expand when heated. In other examples, the LM-TIM 108 completely fills the space within the barrier 104. While the LM-TIM 108 is described as a liquid, in some examples, the LM-TIM 108 may solidify at certain temperatures.

In the illustrated example, the package substrate 106 includes multiple layers some of which are conductive while others are non-conductive. More particularly, in this example, the substrate 106 includes a solder mask layer 110 at the upper surface 200 of the substrate 106. Thus, in this example, the semiconductor die 102 is mounted to and protrudes away from the solder mask layer 110. The solder mask layer 110 is non-conductive to electrically separate the semiconductor die 102 from conductive layers of the package substrate 106, which include a ground plane layer 202 (also referred to herein as the package ground plane layer) and one or more signal and/or power line layers 204. In this example, the ground plane layer 202 is electrically conductive to provide grounding for the package 100. Similarly, the signal and/or power line layers 204 are also conductive to enable electrical routing of power and/or to provide input/output connections to components within the IC package 100 and/or to external pins or other connectors on the exterior of the package 100. In some examples, the package substrate 106 includes multiple non-conductive layers 205 (including the solder mask layer 110) to separate different ones of the conductive layers 202, 204. In the illustrated example, the ground plane layer 202 is closer to the upper surface 200 of the substrate 106 than the other conductive layers 204 are to the upper surface 200. As a result, the ground plane layer 202 is closer to the die 102 (and associated LM-TIM 108) than the other conductive layers 204 are to the die 102 (and associated LM-TIM 108), thereby providing electrical isolation to the die 102 (and associated LM-TIM 108) from the other conductive layers 204.

In the illustrated example, the semiconductor die 102 is mounted or attached to the upper surface 200 of the substrate 106 (e.g., the solder mask layer 110) with a die epoxy 112 that surrounds a perimeter of the semiconductor die 102. Additionally or alternatively, in some examples, the die epoxy 112 is applied between the interfacing surfaces of the semiconductor die 102 and the solder mask layer 110.

In some examples, the LM-TIM 108 fully envelopes and/or encloses the semiconductor die 102 on all surfaces of the die 102 extending above the solder mask layer 110. Additionally or alternatively, the LM-TIM 108 may enclose more than one semiconductor die 102 in one or more containment barriers 104. FIG. 1 illustrates an example wherein there is one die 102. In other examples, more than one die 102 may be included in the IC package 100. Further, ones of the multiple dies may be enclosed in the same TIM and/or distinct portions of TIM in separate containment barriers.

In some examples, the IC package 100 includes a cold plate 206 (also referred to herein as a heat spreader) that attaches to an upper surface of the barrier 104 so as to enclose the space within the barrier 104 filled with the LM-TIM 108. Thus, the cold plate 206 also serves as means for containing the LM-TIM 108. In the illustrated example of FIG. 1, the cold plate 206 is omitted to better illustrate the other components of the example IC package 100 in the plan view.

In some examples, the IC package 100 includes a metal stiffener 114 positioned adjacent an exterior perimeter of the package 100 to provide rigidity and strength to the package. The size of the stiffener 114 and the relative spacing of the stiffener 114 and the barrier 104 depends upon the particular design and/or size of the IC package 100. In this example, the stiffener 114 is spaced apart and distinct from the barrier 104 and made of metal. Further, in this example, the barrier 104 is made of a non-conductive material (e.g., filled or unfilled silicone polymers, foams, polymeric rubbers etc.) to electrically isolate the LM-TIM 108 that interfaces with inner surfaces of the barrier 104. In other examples, the barrier 104 is made of a conductive material (e.g., metal). In such examples, the barrier 104 remains electrically isolated from other components (e.g., the stiffener 114) due to the spacing between the barrier 104 and the stiffener 114.

While the barrier 104 and the non-conductive solder mask layer 110 electrically isolate the LM-TIM 108 from the other components of the IC package 100, the LM-TIM 108 is still electrically coupled to the ground plane layer 202. More particularly, in the illustrated example of FIGS. 1 and 2, one or more solder resist openings (SROs) 116 (further detailed in FIG. 3), such as apertures, for example, extend through opposing surfaces of the solder mask layer 110 and are filled with a conductive material 118 electrically coupling the ground plane layer 202 below the solder mask layer 110 with the LM-TIM 108 above the solder mask layer 110. Fully surrounding or enclosing the semiconductor die 102 with the LM-TIM 108 and electrically coupling the LM-TIM 108 with the ground plane layer 202 enables the LM-TIM 108 to serves as a Faraday cage that provides die-level shielding for the die 102 internal to the IC package 100. As a result, examples disclosed herein provide robust SoC immunity from external RF noises and electro-static discharges. Further, the grounded LM-TIM 108 reduces (e.g., eliminates) radiated emissions from the SoC, thereby enabling compliance with EMC regulatory requirements.

The conductive material 118 is a means for conducting electricity through the SROs 116. In some examples, the conductive material 118 may be the same material as used for the ground plane layer 202 (e.g., copper). Additionally or alternatively, in some examples, the conductive material 118 is the same material as the LM-TIM 108. That is, in some examples, when the LM-TIM 108 is applied around the semiconductor die 102, the LM-TIM 108 extends into and fills the SROs 116 to contact exposed portions of the underlying ground plane layer 202.

In some examples, the LM-TIM 108 includes gallium. More particularly, in some examples, the LM-TIM 108 is a gallium alloy that includes indium and/or tin. Gallium can be corrosive to the copper used for the ground plane layer 202. Accordingly, in some examples, the conductive material 118 is a material distinct from both the ground plane layer 202 and the LM-TIM 108 that is resistant to gallium corrosion. Specifically, in some examples, the conductive material 118 has a nickel finish and/or a nickel-gold finish. In other examples, the conductive material 118 is an electrically conductive epoxy adhesive (ECA).

In this example, multiple SROs 116 are arranged in an array distributed around the semiconductor die 102 at a location between the outer surfaces of the die 102 and the inner surfaces of the barrier 104. In the example illustrated of FIG. 1, the multiple SROs 116 are positioned in straight lines parallel to the barrier 104. In some examples, the multiple SROs 116 are positioned in a circular pattern, a random pattern, or any other suitable arrangement throughout the location between the outer surfaces of the die 102 and the inner surfaces of the barrier 104. In the example of FIG. 1, the SROs 116 are square-shaped. In other examples, each of the SROs 116 can be any shape, such as circular, triangular, rectangular, etc. In some examples, each of the SROs 116 are approximately the same size and have the same dimensions. In some examples, the particular size of the SROs 116 can depend upon the design and available spacing in the IC package 100. Thus, in some examples, the SROs 116 may be larger or smaller (relative to other components) than what is shown in the illustrated example. In other examples, the array of SROs 116 can include multiple SROs 116 of different dimensions and/or sizes. In some examples, the total number of SROs 116 can be more and/or less than the total number of SROs 116 illustrated in FIG. 1. Further, in some examples, rather than discrete openings, the SROs 116 may correspond to one or more elongated trenches extending some or all of the length of a side of the die 102. In some examples, a single trench may extend the entire way around the die 102 and be filled with the conductive material 118 to electrically couple the LM-TIM 108 with the ground plane layer 202.

Figure 3:
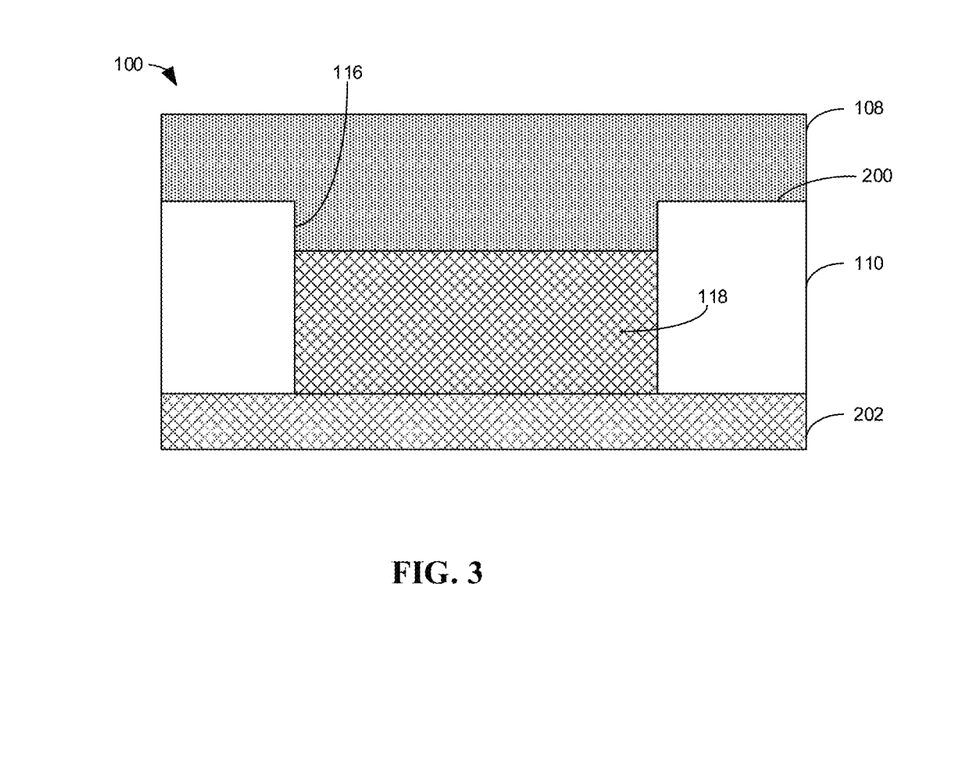
FIG. 3 is an enlarged view of a portion of the example IC package of FIG. 1 corresponding to region A shown in FIG. 2.

FIG. 3 is an enlarged view of a portion of the example IC package 100 of FIG. 1 corresponding to region A shown in FIG. 2. In this example, region A illustrates an example SRO 116 that extends through the solder mask layer 110 and is filled with a conductive material 118 electrically coupling the ground plane layer 202 below the solder mask layer 110 with the LM-TIM 108 above the solder mask layer 110.

As shown in the illustrated example of FIG. 3, the conductive material 118 fills part of the SRO 116 (e.g., aperture) in the solder mask layer 110 such that the conductive material 118 has a thickness that is less than the thickness of the solder mask layer 110. In other examples, the conductive material 118 extends above the upper surface 200 of the solder mask layer 110 such that the conductive material 118 has a thickness that is more than the thickness of the solder mask layer 110. In some examples, different ones of the multiple SROs 116 in an example IC package 100 can vary in thickness and/or conductive material (e.g. nickel finish, nickel-gold finish, and/or conductive epoxy adhesive).

Figure 4:
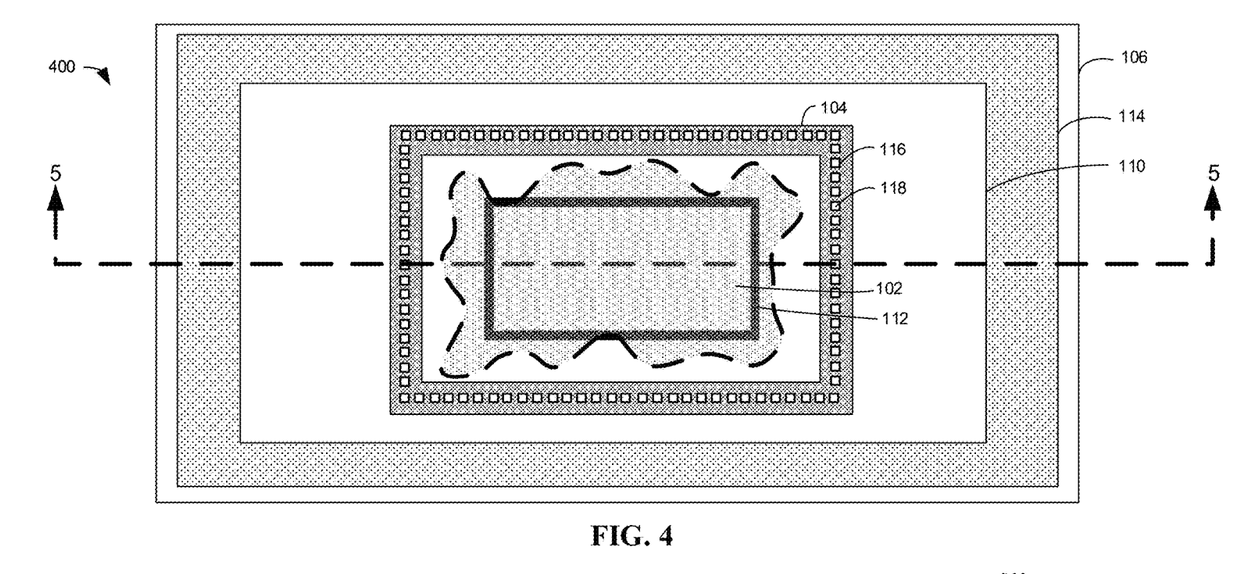
FIG. 4 is a plan view of another example IC package constructed in accordance with teachings disclosed herein.
Figure 5:
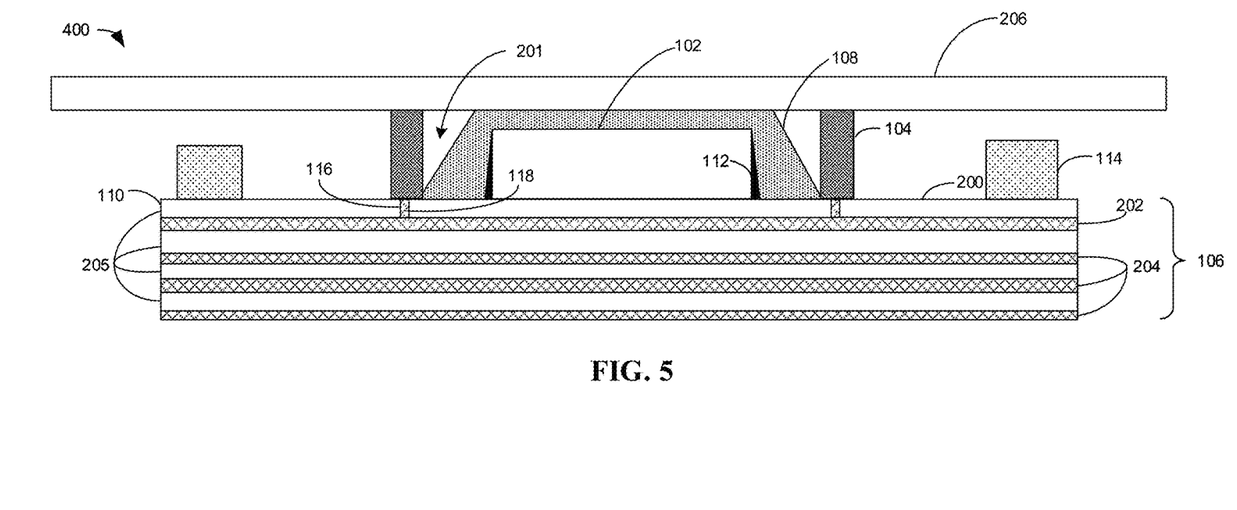
FIG. 5 is a cross-sectional view of the example IC package of FIG. 4 taken along line 5-5.

FIG. 4 is a plan view of another example IC package 400 constructed in accordance with teachings disclosed herein. FIG. 5 is a cross-sectional view of the example IC package 400 taken along line 5-5 of FIG. 4. The example IC package 400 of FIGS. 4 and 5 is similar to the example IC package 100 of FIGS. 1-3 except for the location of the solder resist openings (SROs) 116 and the corresponding conductive material 118 disposed therein. Specifically, in the illustrated example of FIGS. 4 and 5, the SROs 116 and associated conductive material 118 are aligned with and underneath the containment barrier 104. As a result, in this example, the LM-TIM 108 is electrically coupled with the ground plane layer 202 through the conductive material 118 indirectly via the containment barrier 104. Accordingly, in this example, the containment barrier 104 is electrically conductive and forms part of the Faraday cage (along with the LM-TIM 108) surrounding the semiconductor die 102 to mitigate against electrical interference. In some examples, the material of the barrier 104 is made of conductive polymeric materials (e.g., silver filled epoxy, nickel-graphite/silicone polymer, titanium-nickel-carbon composite, etc.) and/or conductive foams (e.g., closed cell foam, open cell foam, etc.). In some such examples, the material used for the barrier 104 is dispensed using an automatic control machine. In other examples, the containment barrier 104 is laser-cut or die-cut from a sheet of material and/or created using one or more gasket materials (e.g., packaged in rolls) that can be formed in a variety of cross-section shapes. Such materials can include simple polymeric rubbers, foams, thermal pads, or gasket materials.

In the example IC package 400, multiple SROs 116 are arranged in an array distributed at a location within the solder mask layer 110 aligned with the containment barrier 104. Positioning the SROs 116 in alignment with the barrier 104 enables the barrier 104 to be positioned closer to the semiconductor die 102 than in the illustrated example of FIGS. 1-3 in which space is needed for the SROs 116 between the barrier 104 and the semiconductor die 102. This is a beneficial option when spatial constraints are a limited design factor for a particular IC package. In the illustrated example of FIG. 4, the multiple SROs 116 are positioned in a straight line parallel to and positioned between the outer surface and inner surface of the barrier 104. In other examples, the SROs 116 are positioned in any other suitable pattern or arrangement. In some examples, separate SROs 116 (other than those aligned with the barrier 104) are located between the barrier 104 and the die 102 (e.g., similar to what is shown in FIGS. 1-3) to enable the direct electrical coupling of the LM-TIM 108 with the ground plane layer 202 in addition to the indirect coupling via the conductive barrier 104. Additionally or alternatively, in some examples, the SROs 116 are positioned and/or dimensioned to be partially under the barrier 104 and to partially extend inward of the inner surface of the barrier 104 toward the die 102.

Figure 6:
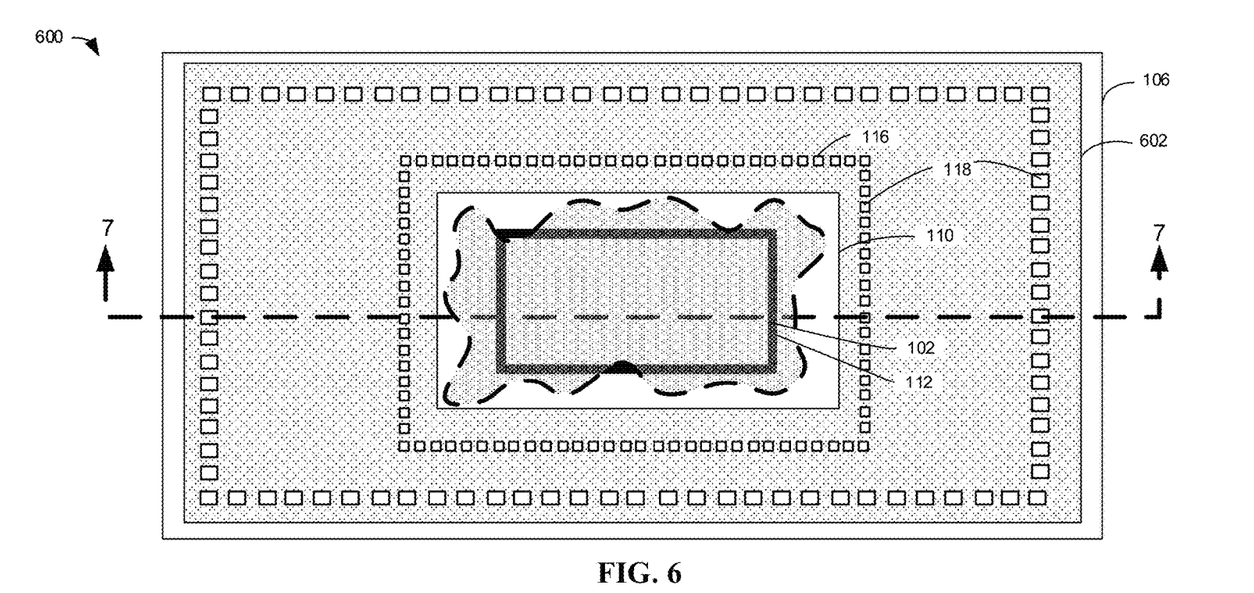
FIG. 6 is a plan view of another example IC package constructed in accordance with teachings disclosed herein.
Figure 7:
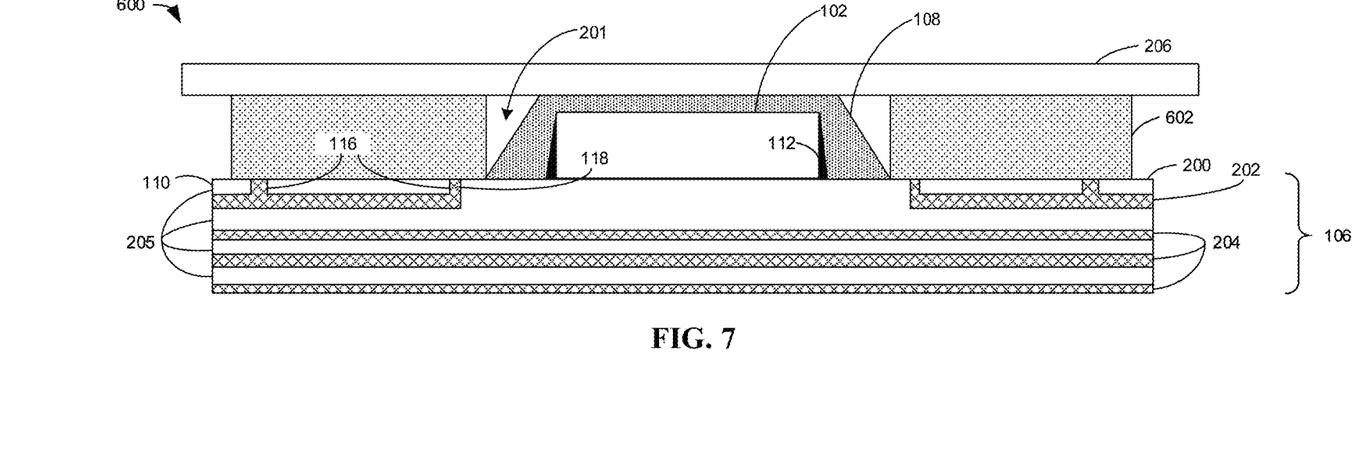
FIG. 7 is a cross-sectional view of the example IC package of FIG. 6 taken along line 7-7.

FIG. 6 is a plan view of another example IC package 600 constructed in accordance with teachings disclosed herein. FIG. 7 is a cross-sectional view of the example IC package 600 taken along line 7-7 of FIG. 6. The example IC package 600 of FIGS. 6 and 7, is similar to the example IC package 400 of FIGS. 4 and 5 except that the IC package 600 of FIGS. 6 and 7 includes a stiffener 602 that also serves as a means for containing the LM-TIM 108 (e.g., instead of the barrier 104 shown in FIGS. 4 and 5). Further, the example IC package 600 of FIGS. 6 and 7 differs from the example IC package 400 of FIGS. 4 and 5 based on the location of the solder resist openings (SROs) 116 and the corresponding conductive material 118 disposed therein. Specifically, in the illustrated example of FIGS. 6 and 7, the SROs 116 and associated conductive material 118 are aligned with and underneath the metal stiffener 602, which has a larger dimension than the stiffener 114 in FIGS. 4 and 5. As with the stiffener 114 in the previous examples, the stiffener 602 of FIGS. 6 and 7 is made of metal and, therefore, electrically conductive. As a result, in this example, the LM-TIM 108 is electrically coupled with the ground plane layer 202 through the conductive material 118 indirectly via the metal stiffener 602. In such examples, the stiffener 602 forms part of the Faraday cage (along with the LM-TIM 108) surrounding the semiconductor die 102 to mitigate against electrical interference. In some examples, a conductive adhesive can be used to attach the metal stiffener 602 to the substrate 106 to provide mechanical flexibility and strength that can withstand mechanical stresses resulting from coefficient of thermal expansion (CTE) mismatch effects. Further, the conductive adhesive ensures a reliable (e.g., relatively low ohmic) contact with the ground plane layer 202.

In this example IC package 600, multiple SROs 116 are arranged in a first array distributed at a location within the solder mask layer 110 aligned with the metal stiffener 602 and encircling the semiconductor die 102. Additionally or alternatively, a second array of multiple SROs 116 are distributed to encircle both the first array of multiple SROs 116 and the semiconductor die 102. In some examples, a second array of multiple SROs 116 may be needed to provide sufficient grounding contact for the example IC package 600. That is, in some examples, the number and/or size of the SROs 116 is selected so that the stiffener 602 makes relatively low ohmic contact with the ground plane layer 202. Further, in some examples, the separate arrays or rings of SROs 116 serve to reduce (e.g., prevent) electrical interference, particularly in examples where the stiffener 602 is relatively large. For instance, if the width of the stiffener 602 is comparable to or larger than about one fourth of a wavelength of the highest expected radio frequency (e.g., approximately 5 mm for a frequency of 7.125 GHz), then two rings or arrays of the SROs 116 may be implemented for more robust protection against electrical interference. For a stiffener 602 with a width of less than 2.5 mm, a single array or ring of SROs 116 may be adequate.

While two arrays of SROs 116 are shown in the illustrated example, in other examples, any number of arrays of multiple SROs 116 may be used to provide sufficient grounding contact for the example IC package 600. In the example illustrated of FIG. 6, the multiple SROs 116 are positioned in straight lines parallel to and positioned between the outer surface and inner surface of the metal stiffener 602. In some examples, the multiple SROs 116 are positioned in a circular pattern, a random pattern, or any other suitable arrangement throughout the location corresponding to the area within the outer surface and inner surface of the metal stiffener 602. In some examples, separate SROs 116 with associated conductive material 118 are located between the stiffener 114 and the die 102 (e.g., similar to what is shown in FIGS. 4 and 5) to enable to direct electrical coupling of the LM-TIM 108 with the ground plane layer 202 in addition to the indirect coupling via the stiffener 602. Additionally or alternatively, in some examples, the SROs 116 are positioned and/or dimensioned to be partially under the stiffener 602 and to partially extend inward of the inner surface of the stiffener 602 toward the die 102.

Another distinction between the example IC package 600 of FIGS. 6 and 7 and the IC package 400 of FIGS. 4 and 5 is the structure of the ground plane layer 202. Specifically, as shown in FIG. 5, the electrically conductive material of the ground plane layer 202 in the example IC package 400 extends across IC package 400 underneath the semiconductor die 102. As explained above, the semiconductor die 102 in the IC package 400 of FIGS. 4 and 5 is separated from the ground plane layer 202 by the solder mask layer 110. By contrast, the electrically conductive material of the ground plane layer 202 in the example IC package 600 of FIGS. 6 and 7 does not pass directly underneath the semiconductor die 102. The particular design and/or structure of the ground plane layer 202 does not affect the ability of the LM-TIM 108 to form a Faraday cage around the semiconductor die 102 to mitigate against electrical interference. Thus, the structure of the example ground plane layer 202 shown in FIG. 7 could alternatively be implemented in the IC package 100 of FIGS. 1-3 and/or in the IC package 400 of FIGS. 4 and 5. Likewise, the structure of the example ground plane layer 202 shown in FIGS. 2 and 5 could alternatively be implemented in the IC package 600 of FIGS. 6 and 7. Further, the structure of the ground plane layer 202 in any examples disclosed herein may partially extend underneath the semiconductor die 102 without extending the entire way across.

Figure 8:
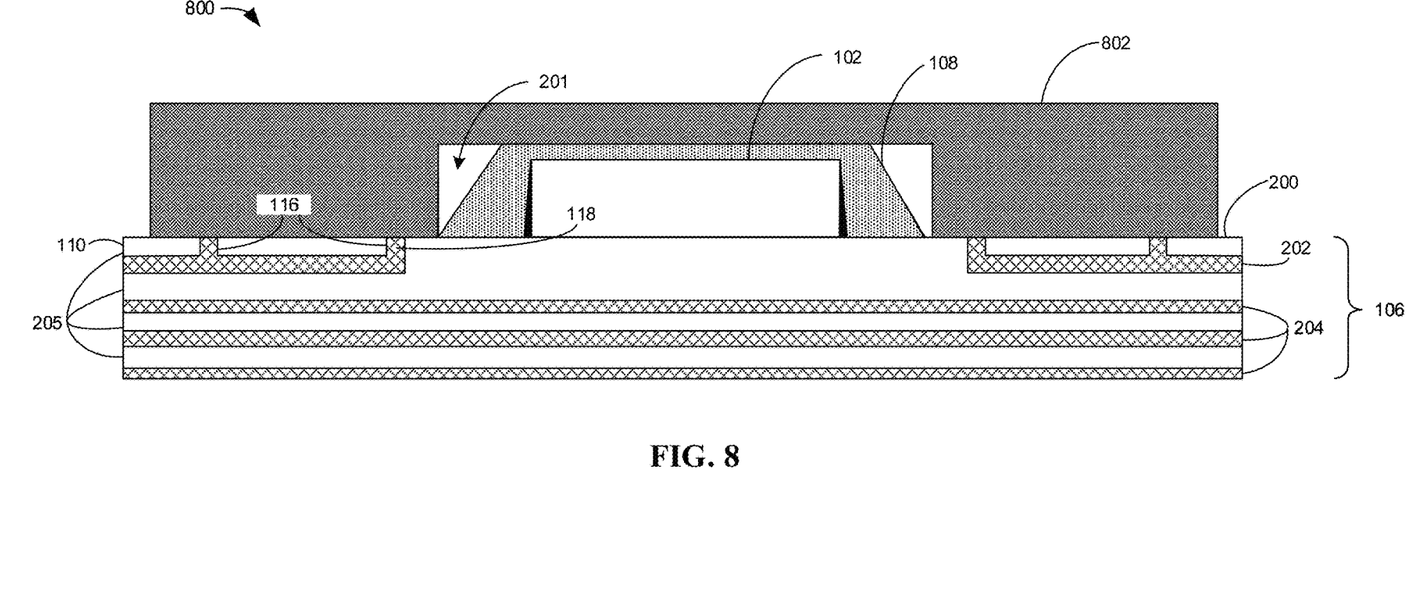
FIG. 8 is a cross-sectional view of another example IC package constructed in accordance with teachings disclosed herein.

FIG. 8 is a cross-sectional view of another example IC package 800 similar to the example IC package 600 shown in FIG. 7. The example IC package 800 of FIG. 8 differs from the example IC package 600 of FIG. 6 in that the IC package 800 of FIG. 8 includes an integrated heat spreader (IHS) 802 (also referred to herein as a package lid) structured to serve as a means for containing the LM-TIM 108 around the semiconductor die 102 (e.g., instead of the stiffener 602 and separate cold plate 206 as shown in FIG. 7). In this example, the integrated heat spreader 802 is electrically conductive. As a result, in this example, the LM-TIM 108 is electrically coupled with the ground plane layer 202 through the conductive material 118 indirectly via the IHS 802 such that the IHS 802 becomes part of the Faraday cage (along with the LM-TIM 108) that surrounds the die 102 to mitigate against electrical interference.

In some examples, the SROs 116 and associated conductive material 118 is arranged to electrically couple the integrated heat spreader 802 to the ground plane layer 202 in a similar manner as the SROs 116 described above in connection with FIGS. 6 and 7. Further, as described above, while the ground plane layer 202 in FIG. 8 is shown similar to the ground plane layer 202 in FIG. 7, the structure of the ground plane layer 202 may be modified in any suitable manner (e.g., similar to the ground plane layer 202 as shown in FIGS. 2 and 5).

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

As used herein, singular references (e.g., "a", "an", "first", "second", etc.) do not exclude a plurality. The term "a" or "an" entity, as used herein, refers to one or more of that entity. The terms "a" (or "an"), "one or more", and "at least one" can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

From the foregoing, it will be appreciated that example methods, apparatus and articles of manufacture have been disclosed that utilize the high electrical conductivity of LM-TIM to make the LM-TIM itself an integral part of a die-level Faraday cage that provides a shielding solution internal to an associated IC package for one or more semiconductor dies while also serving as a means for dissipating heat from dies.

Example 1 includes an integrated circuit (IC) package comprising a substrate including a ground plane layer and a solder mask layer, a semiconductor die attached to the substrate, the solder mask layer separating the semiconductor die from the ground plane layer, and a thermal interface material (TIM) surrounding at least a portion of the semiconductor die, the TIM electrically coupled to the ground plane layer.

Example 2 includes the IC package as defined in example 1, wherein the solder mask layer includes an aperture extending therethrough, the TIM electrically coupled to the ground plane layer via the aperture.

Example 3 includes the IC package as defined in example 2, further including a conductive material in the aperture to electrically couple the TIM and the ground plane layer, the conductive material different than the TIM and different than a material of the ground plane layer.

Example 4 includes the IC package as defined in example 3, wherein the TIM is a liquid metal thermal interface material.

Example 5 includes the IC package as defined in example 4, wherein the liquid metal thermal interface material includes gallium.

Example 6 includes the IC package as defined in example 3, wherein the conductive material includes at least one of nickel or gold.

Example 7 includes the IC package as defined in example 3, wherein the conductive material is a conductive epoxy adhesive.

Example 8 includes the IC package as defined in example 2, further including a containment barrier for the TIM that is electrically non-conductive and spaced apart from the semiconductor die, the aperture extending through the solder mask layer at a location between facing surfaces of the containment barrier and the semiconductor die.

Example 9 includes the IC package as defined in example 2, wherein the solder mask layer includes multiple apertures arranged in an array distributed around the semiconductor die, the TIM electrically coupled to the ground plane layer through the multiple apertures.

Example 10 includes the IC package as defined in example 9, wherein the array is a first array, ones of the multiple apertures arranged in a second array different than the first array, the ones of the multiple apertures in the second array distributed to surround the semiconductor die, the first array closer to the semiconductor die than the second array.

Example 11 includes the IC package as defined in example 9, wherein the TIM is to fully envelope the semiconductor die adjacent the substrate, the TIM electrically coupled to the ground plane layer to create a Faraday cage surrounding the semiconductor die.

Example 12 includes the IC package as defined in example 1, further including a containment barrier spaced apart from and surrounding the semiconductor die, the TIM to fill a space between the containment barrier and the semiconductor die.

Example 13 includes the IC package as defined in example 12, further including a conductive material that extends through the solder mask layer to electrically couple the containment barrier and the ground plane layer, the TIM electrically coupled to the ground plane layer via the containment barrier and the conductive material.

Example 14 includes the IC package as defined in example 13, wherein the conductive material extends through the solder mask layer via a plurality of spaced apart apertures extending through the solder mask layer, the plurality of spaced apart apertures including (1) a first array of apertures encircling the semiconductor die and (2) a second array of apertures encircling both the semiconductor die and the first array of apertures.

Example 15 includes the IC package as defined in example 12, wherein the containment barrier is a metal package stiffener.

Example 16 includes the IC package as defined in example 12, wherein the containment barrier is an integrated heat spreader (IHS).

Example 17 includes an integrated circuit (IC) package comprising a solder mask layer having opposing first and second surfaces, a semiconductor die adjacent the first surface, a ground plane layer adjacent the second surface, and a TIM in contact with the first surface of the solder mask layer and exterior surfaces of the semiconductor die, the TIM electrically coupled to the ground plane layer.

Example 18 includes the IC package as defined in example 17, wherein the solder mask layer includes an aperture extending therethrough between the first and second surface, the TIM electrically coupled to the ground plane layer via the aperture.

Example 19 includes the IC package as defined in example 18, further including a conductive material disposed in the aperture to electrically couple the TIM and the ground plane layer.

Example 20 includes the IC package as defined in example 19, wherein the TIM is a liquid metal thermal interface material.

Example 21 includes the IC package as defined in example 20, wherein the TIM includes gallium, and the conductive material is different than the TIM and different than a material of the ground plane layer to resist gallium corrosion.

Example 22 includes the IC package as defined in example 21, wherein the conductive material includes at least one of nickel or gold.

Example 23 includes the IC package as defined in example 21, wherein the conductive material includes a conductive epoxy adhesive.

Example 24 includes the IC package as defined in example 19, wherein the conductive material extends through the solder mask layer via a plurality of spaced apart apertures extending through the solder mask layer, the plurality of spaced apart apertures distributed (1) in a first ring encircling the semiconductor die and (2) in a second ring encircling both the semiconductor die and the first ring.

Example 25 includes the IC package as defined in example 19, further including a containment barrier that is electrically non-conductive and spaced apart from the conductive material, the conductive material extending through the solder mask layer at a location between the containment barrier and the semiconductor die.

Example 26 includes the IC package as defined in example 17, wherein the solder mask layer includes multiple apertures extending therethrough, ones of the multiple apertures arranged in a ring to surround the semiconductor die, the TIM electrically coupled to the ground plane layer through the multiple apertures.

Example 27 includes the IC package as defined in example 26, wherein the ring is a first ring, ones of the multiple apertures arranged in a second ring different than the first ring, the ones of the multiple apertures in the second ring to surround the semiconductor die, the first ring closer to the semiconductor die than the second ring.

Example 28 includes the IC package as defined in example 26, wherein the TIM is to fully enclose the semiconductor die adjacent a first side of the solder mask layer, the TIM electrically coupled to the ground plane layer to create a Faraday cage surrounding the semiconductor die.

Example 29 includes the IC package as define in example 17, further including a containment barrier spaced apart from and surrounding the semiconductor die, the TIM disposed between the containment barrier and the semiconductor die.

Example 30 includes the IC package as defined in example 29, further including a conductive material extending through the solder mask layer to electrically couple the containment barrier to the ground plane layer, the TIM electrically coupled to the ground plane layer via the containment barrier.

Example 31 includes the IC package as defined in example 29, further including a package stiffener that is spaced apart from the containment barrier, the containment barrier between the semiconductor die and the package stiffener.

Example 32 includes the IC package as defined in example 29, wherein the containment barrier is an integrated heat spreader (IHS).

Example 33 includes an integrated circuit (IC) package comprising a semiconductor die, a ground plane layer, a solder mask layer disposed between the ground plane layer and the semiconductor die, and means for dissipating heat from the semiconductor die, the heat dissipating means to be in contact with exterior surfaces of the semiconductor die protruding away from the solder mask layer, the heat dissipating means electrically coupled to the ground plane layer.

Example 34 includes the IC package as defined in example 33, further including an opening in the solder mask layer, the heat dissipating means electrically coupled to the ground plane layer through the opening.

Example 35 includes the integrated circuit (IC) package as defined in example 34, further including means for conducting electricity through the opening in the solder mask layer, the electricity conducting means to electrically couple the heat dissipating means to the ground plane layer.

Example 36 includes the integrated circuit (IC) package as defined in example 33, further including means for containing the heat dissipating means, the containing means spaced apart from and surrounding the semiconductor die, the heat dissipating means to fill a space between the containing means and the semiconductor die.

Example 37 includes the IC package as defined in example 36, wherein the containing means is electrically conductive and electrically coupled to the ground plane layer, the heat dissipating means electrically coupled to the ground plane layer via the containing means.

Example 38 includes the IC package as defined in example 37, wherein the containing means is a metal package stiffener.

Example 39 includes the IC package as defined in example 37, wherein the containing means is a package lid of the IC package.

Example 40 includes the IC package as defined in example 37, wherein the containing means is an electrically conductive foam barrier.

Example 41 includes the IC package as defined in example 36, wherein the containing means is electrically non-conductive and spaced apart from the semiconductor die, the heat dissipating means electrically coupled to the ground plane layer via an opening in the solder mask layer between the containing means and the semiconductor die.

Example 42 includes the IC package as defined in example 34, wherein the heat dissipating means is to fully cover the semiconductor die adjacent the solder mask layer to create a Faraday cage around the semiconductor die.

Example 43 includes the IC package as defined in example 34, further including multiple openings distributed in the solder mask layer to surround the semiconductor die, the heat dissipating means electrically coupled to the ground plane layer through the multiple openings. the IC package as defined in example 43, wherein a first set of the multiple openings are associated with a first array of openings, a second set of the openings are associated with a second array of openings different than the first array of openings, the second array of openings to surround the semiconductor die, the first array of openings closer to the semiconductor die than the second array of openings.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

The following claims are hereby incorporated into this Detailed Description by this reference, with each claim standing on its own as a separate embodiment of the present disclosure.

What is claimed is:

1. An integrated circuit (IC) package comprising:
a substrate including a ground plane layer and a solder mask layer, the solder mask layer including an aperture extending therethrough;
a semiconductor die attached to the substrate, the solder mask layer separating the semiconductor die from the ground plane layer;
a thermal interface material (TIM) surrounding at least a portion of the semiconductor die; and
a conductive material in the aperture, the TIM electrically coupled to the ground plane layer via the conductive material, the conductive material different than the TIM and different than a material of the ground plane layer.

2. The IC package as defined in claim 1, wherein the TIM is a liquid metal thermal interface material.

3. The IC package as defined in claim 2, wherein the liquid metal thermal interface material includes gallium.

4. The IC package as defined in claim 1, wherein the conductive material includes at least one of nickel or gold.

5. The IC package as defined in claim 1, wherein the conductive material is a conductive epoxy adhesive.

6. The IC package as defined in claim 1, wherein the solder mask layer includes multiple apertures arranged in an array distributed around the semiconductor die, the TIM electrically coupled to the ground plane layer through the multiple apertures.

7. The IC package as defined in claim 6, wherein the array is a first array, ones of the multiple apertures arranged in a second array different than the first array, the ones of the multiple apertures in the second array distributed to surround the semiconductor die, the first array closer to the semiconductor die than the second array.

8. The IC package as defined in claim 6, wherein the TIM fully envelopes a perimeter of the semiconductor die adjacent the substrate, the TIM electrically coupled to the ground plane layer to create a Faraday cage surrounding the semiconductor die.

9. The IC package as defined in claim 1, further including a containment barrier spaced apart from and surrounding the semiconductor die, the TIM to filling a space between the containment barrier and the semiconductor die.

10. The IC package as defined in claim 9, wherein the conductive material is electrically coupled to the containment barrier and the ground plane layer, the TIM electrically coupled to the ground plane layer via the containment barrier and the conductive material.

11. The IC package as defined in claim 10, wherein the aperture is one of a plurality of spaced apart apertures extending through the solder mask layer, the plurality of spaced apart apertures including (1) a first array of apertures encircling the semiconductor die and (2) a second array of apertures encircling both the semiconductor die and the first array of apertures.

12. The IC package as defined in claim 9, wherein the containment barrier is a metal package stiffener.

13. The IC package as defined in claim 9, wherein the containment barrier is an integrated heat spreader (IHS).

14. An integrated circuit (IC) package comprising:
a substrate including a ground plane layer and a solder mask layer;
a semiconductor die attached to the substrate, the solder mask layer separating the semiconductor die from the ground plane layer;
a thermal interface material (TIM) surrounding at least a portion of the semiconductor die, the TIM electrically coupled to the ground plane layer; and
a containment barrier for the TIM that is electrically non-conductive and spaced apart from the semiconductor die, an aperture extending through the solder mask layer at a location between facing surfaces of the containment barrier and the semiconductor die.

15. An integrated circuit (IC) package comprising:
a solder mask layer having opposing first and second surfaces, the solder mask layer including an aperture extending therethrough between the first and second surfaces;
a semiconductor die adjacent the first surface;
a ground plane layer adjacent the second surface;
a TIM in contact with the first surface of the solder mask layer and exterior surfaces of the semiconductor die;
a conductive material disposed in the aperture, the TIM electrically coupled to the ground plane layer via the conductive material; and
a containment barrier that is electrically non-conductive and spaced apart from the conductive material, the conductive material extending through the solder mask layer at a location between the containment barrier and the semiconductor die.

16. The IC package as defined in claim 15, wherein the conductive material extends through the solder mask layer via a plurality of spaced apart apertures extending through the solder mask layer, the plurality of spaced apart apertures distributed (1) in a first ring encircling the semiconductor die and (2) in a second ring encircling both the semiconductor die and the first ring.

17. The IC package as defined in claim 15, wherein the TIM is disposed between the containment barrier and the semiconductor die.

18. The IC package as defined in claim 17, further including a package stiffener that is spaced apart from the containment barrier, the containment barrier between the semiconductor die and the package stiffener.

19. An integrated circuit (IC) package comprising:
a semiconductor die;
a ground plane layer;
a solder mask layer disposed between the ground plane layer and the semiconductor die;
means for dissipating heat from the semiconductor die, the heat dissipating means contacting exterior surfaces of the semiconductor die protruding away from the solder mask layer; and
means for containing the heat dissipating means, the containing means being non-conductive and spaced apart from the semiconductor die, the heat dissipating means filling a space between the containing means and the semiconductor die, the heat dissipating means electrically coupled to the ground plane layer via an opening in the solder mask layer between the containing means and the semiconductor die.

20. The integrated circuit (IC) package as defined in claim 19, wherein the containing means surrounds the semiconductor die.

21. The IC package as defined in claim 20, wherein the containing means is electrically conductive and electrically coupled to the ground plane layer, the heat dissipating means electrically coupled to the ground plane layer via the containing means.

22. The IC package as defined in claim 21, wherein the containing means is a package lid of the IC package.

23. The IC package as defined in claim 21, wherein the containing means is an electrically conductive foam barrier.

24. The IC package as defined in claim 19, wherein the heat dissipating means is to fully cover the semiconductor die adjacent the solder mask layer to create a Faraday cage around the semiconductor die.

25. The IC package as defined in claim 19, further including multiple ones of the opening distributed in the solder mask layer to surround the semiconductor die, the heat dissipating means electrically coupled to the ground plane layer through the multiple ones of the opening.

* * * * *

UNITED STATES PATENT AND TRADEMARK OFFICE
CERTIFICATE OF CORRECTION

PATENT NO. : 11,616,000 B2
APPLICATION NO. : 17/359085
DATED : March 28, 2023
INVENTOR(S) : Han et al.

It is certified that error appears in the above-identified patent and that said Letters Patent is hereby corrected as shown below:

In the Claims

At Column 14, Line 61, in Claim 9, delete "TIM to filling" and insert -- TIM filling --.

Signed and Sealed this
Twenty-third Day of May, 2023

Katherine Kelly Vidal
*Director of the United States Patent and Trademark Office*